United States Patent
Zhang et al.

(10) Patent No.: US 7,168,484 B2
(45) Date of Patent: Jan. 30, 2007

(54) THERMAL INTERFACE APPARATUS, SYSTEMS, AND METHODS

(75) Inventors: Yuegang Zhang, Cupertino, CA (US); C. Michael Garner, Pleasanton, CA (US); Andrew A. Berlin, San Jose, CA (US); Valluri Rao, Saratoga, CA (US); Bryan M. White, Smyrna, GA (US); Paul A. Koning, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/612,711

(22) Filed: Jun. 30, 2003

(65) Prior Publication Data

US 2004/0261987 A1    Dec. 30, 2004

(51) Int. Cl.
*F28F 7/00*    (2006.01)
*H05K 7/20*    (2006.01)

(52) U.S. Cl. ............... 165/185; 165/80.3; 165/104.33

(58) Field of Classification Search ............... 165/185, 165/80.3, 104.33; 361/704, 705, 712, 713; 257/720, 719, 717; 501/95.1, 95.2; 423/447.1
See application file for complete search history.

(56) References Cited

U.S. PATENT DOCUMENTS

| | | | |
|---|---|---|---|
| 5,102,824 A | 4/1992 | Neugebauer et al. | 438/28 |
| 5,316,080 A | 5/1994 | Banks et al. | 165/185 |
| 5,604,037 A | 2/1997 | Ting et al. | 428/408 |
| 5,825,624 A | 10/1998 | Arnold et al. | 361/708 |
| 5,837,081 A | 11/1998 | Ting et al. | 156/89.26 |
| 5,965,267 A | 10/1999 | Nolan et al. | 428/408 |
| 5,972,265 A | 10/1999 | Marra et al. | 264/112 |
| 6,312,303 B1 | 11/2001 | Yaniv et al. | 445/24 |
| 6,407,922 B1 | 6/2002 | Eckblad et al. | 361/704 |
| 6,504,292 B1 * | 1/2003 | Choi et al. | 313/310 |
| 6,630,772 B1 | 10/2003 | Bower et al. | 313/311 |
| 6,651,736 B2 * | 11/2003 | Chiu et al. | 165/185 |
| 6,921,462 B2 | 7/2005 | Montgomery et al. | |
| 2002/0105071 A1 * | 8/2002 | Mahajan et al. | 257/720 |
| 2003/0117770 A1 * | 6/2003 | Montgomery et al. | 361/687 |
| 2003/0135971 A1 * | 7/2003 | Liberman et al. | 29/419.1 |
| 2003/0179559 A1 * | 9/2003 | Engelhardt et al. | 361/780 |
| 2003/0231471 A1 * | 12/2003 | De Lorenzo et al. | 361/719 |

(Continued)

FOREIGN PATENT DOCUMENTS

EP    0538798    4/1993

(Continued)

OTHER PUBLICATIONS

Andrews, R., et al., "Nanotube Composite Carbon Fibers", *Applied Physics Letters*, 75(9), (Aug. 30, 1999), 1329-1331.

(Continued)

*Primary Examiner*—Tho Duong
(74) *Attorney, Agent, or Firm*—Schwegman, Lundberg, Woessner & Kluth, P.A.

(57) ABSTRACT

An apparatus and system, may include a thermal interface material comprised of an array of carbon nanotubes and a buffer layer disposed between the thermal interface material and one of a die or a heat spreader. In some embodiments the carbon nanotubes may be formed above a buffer layer formed above a surface of the heat spreader.

15 Claims, 5 Drawing Sheets

U.S. PATENT DOCUMENTS

2004/0005736 A1* 1/2004 Searls et al. ............ 438/122
2004/0150100 A1* 8/2004 Dubin et al. ............ 257/720
2004/0265489 A1* 12/2004 Dubin .................... 427/212
2006/0054490 A1 3/2006 Montgomery et al.

FOREIGN PATENT DOCUMENTS

| EP | 0689244 | 12/1995 |
|----|---------|---------|
| EP | 1054036 | 11/2000 |
| EP | 1109218 | 6/2001 |
| WO | WO-00/33628 | 6/2000 |
| WO | WO-01/30694 | 5/2001 |
| WO | WO-01/92381 | 12/2001 |

OTHER PUBLICATIONS

Bellar, R J., et al., "High Conduction Thermal Interface Material", *IBM Technical Disclosure Bulletin*, 36 (10), (Oct. 1, 1993), 581-583.

Zhang, Y., et al., "Formation of metal nanowires on suspended single-walled carbon nanotubes", *Applied Physics Letters*, 77(19), (Nov. 6, 2000), 3015-3017.

* cited by examiner

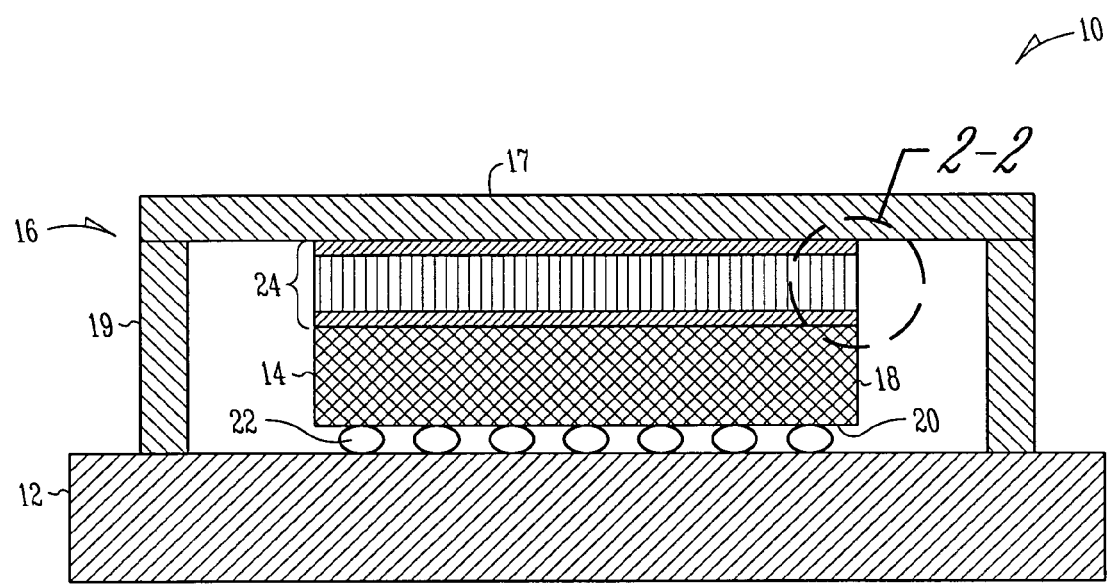
Fig.1
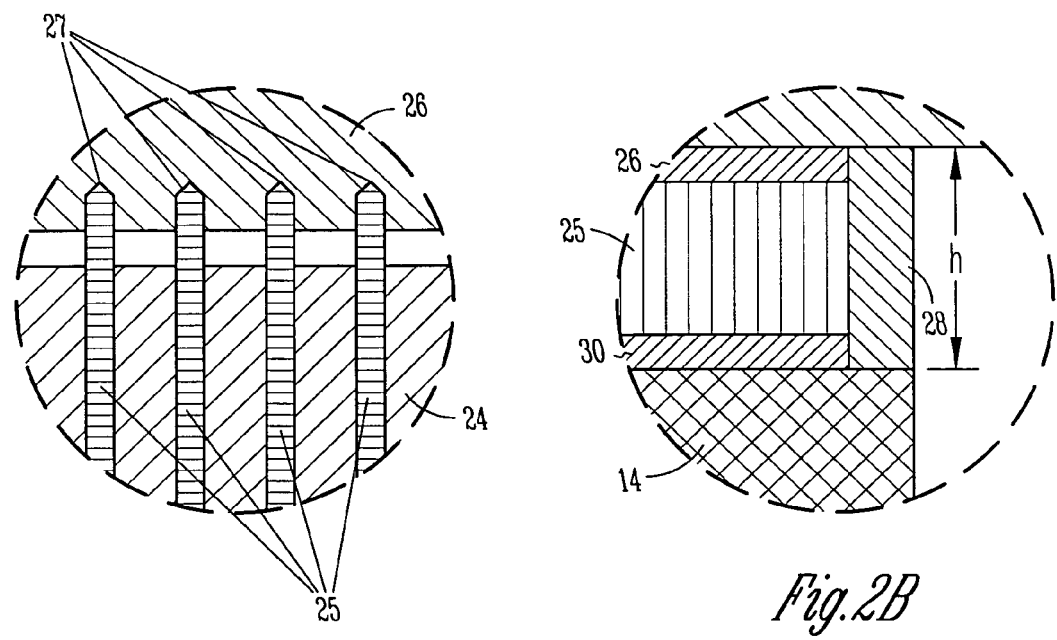
Fig.2A
Fig.2B

THERMAL INTERFACE APPARATUS, SYSTEMS, AND METHODS

TECHNICAL FIELD

The subject matter relates generally to apparatus, systems, and methods used to assist in transferring heat from one element or body, such as a circuit, to another, such as a heat sink.

BACKGROUND INFORMATION

Electronic components, such as integrated circuits, may be assembled into component packages by physically and electrically coupling them to a substrate. During operation, the package may generate heat which can be dissipated to help maintain the circuitry at a desired temperature. Heat sinks, including heat spreaders, may be coupled to the package using a suitable thermal interface to assist in transferring heat from the package to the heat sink.

BRIEF DESCRIPTION OF THE DRAWINGS

FIG. 1 is an cross-section view of an apparatus according to various embodiments;

FIGS 2A and 2B are details of the view shown in FIG. 1;

DETAILED DESCRIPTION

Figure 3:
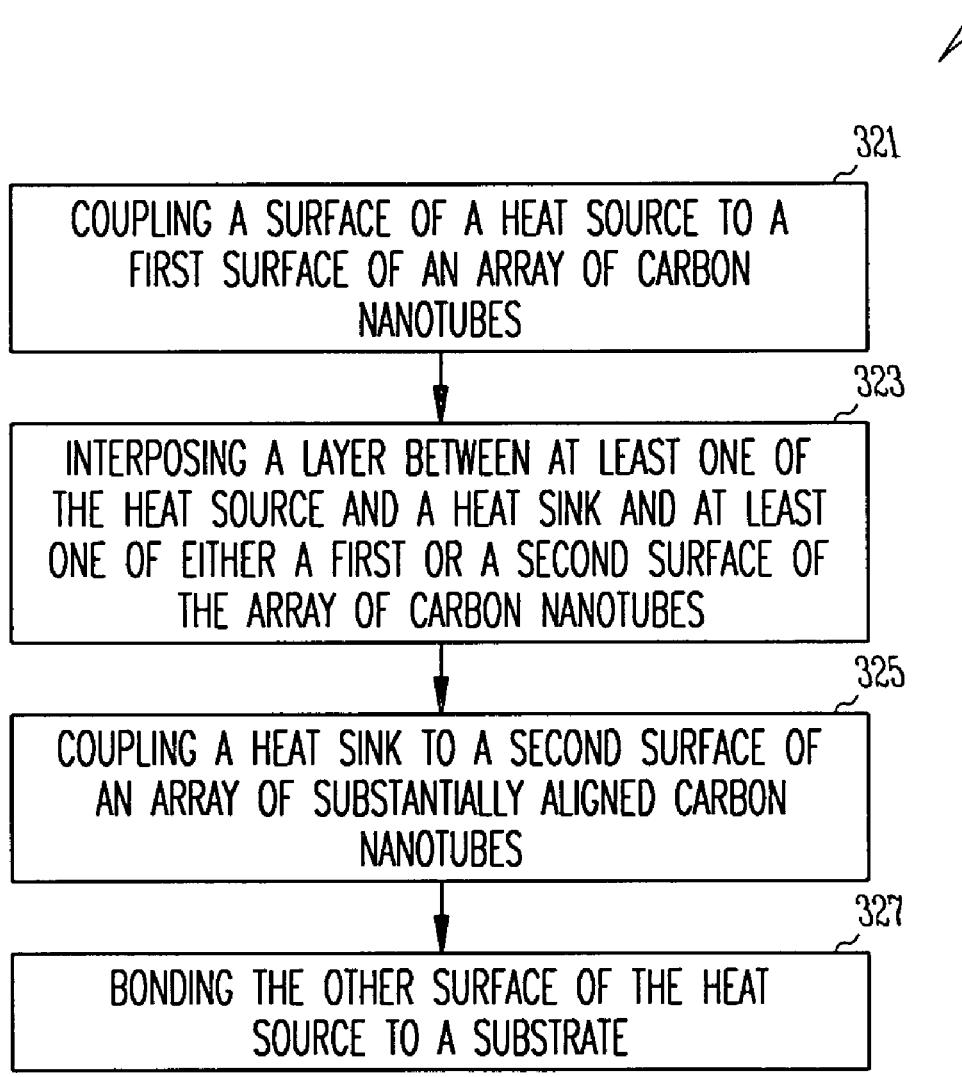
FIGS. 3–5 are flow charts illustrating several methods according to various embodiments.

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure. The following detailed description, therefore, is not to be taken in a limiting sense.

Examples and embodiments merely typify possible variations. Individual components and functions are optional unless explicitly required, and the sequence of operations may vary. Portions and features of some embodiments may be included in or substituted for those of others. The following description is, therefore, not to be taken in a limiting sense.

FIG. 1 is a cross section view of an apparatus 10 according to various embodiments. Apparatus 10 includes a package substrate 12, a die 14 and a thermal management aid such as a heat sink or an integral heat spreader 16 which is mounted adjacent the die 14 and separated from it by a gap.

The substrate of die 14 is typically made of silicon and has frontside and backside surfaces. The die 14 also has an integrated circuit 20 and solder bump contacts 22 on the frontside surface. The contacts 22 connect with contact pads (not shown) on the upper surface of package substrate 12. In some embodiments, the contacts 22 are manufactured according to a commonly used controlled collapse chip connect (C4) process.

In use, electric signals and power are provided to the integrated circuit 20. Operation of the integrated circuit 20 causes heating of die 14. Heat is transferred from the integrated circuit 20 through the substrate of die 14 to the heat spreader 16 through a thermal interface material 24 interposed in the gap between them.

In FIG. 1, the heat spreader 16 includes a top plate 17 and supporting side walls 19. In some embodiments the side walls 19 completely surround the die 14. In one embodiment the heat spreader 16 is coupled to a further heat sink (not shown) which may or may not be actively cooled.

In some embodiments, the thermal interface material 24 comprises an array 25 of either densely packed multi-walled or single walled carbon nanotubes or a combination of both single and double walled nanotubes. In some embodiments, either the heat spreader 16 or a lower surface thereof, is formed of, or coated with, a high thermal conductivity metal (and its alloys) such as molybdenum or copper, semiconductor material such as silicon or compounds as SiC (silicon carbide). In some embodiments the buffer layer consists of a film selected from the group consisting of Cr, Mo, Ti. W. SiC and TiC.

In some embodiments, a first layer 26 is deposited on the surface of the heat spreader 16 prior to growing the array of carbon nanotubes 25 in order to prevent a chemical reaction at the surface of the substrate of heat spreader 16 between the heat spreader surface material and reactive gases which may be used to support the growth of the nanotubes in either a thermal or plasma assisted chemical vapor deposition (CVD) method. When grown by the CVD process, some of the carbon nanotubes of the array of nanotubes 25 are aligned with a substantial number of the carbon nanotubes oriented substantially perpendicular to the surface of heat spreader 16.

Carbon nanotubes have a coefficient of thermal conductivity along their longitudinal axis which is relatively high relative to the conductivity orthogonal to the longitudinal axis. The thermal conductivity of carbon nanotubes along their longitudinal axes is substantially higher than that of other materials used for thermal intermediates. The thermal conductivity of multi-walled nanotubes is about 3000 to 4000 W/m-K and theoretically about 6000 W/m-K for single walled nanotubes.

In some embodiments, a catalyst is applied to either the surface of the heat spreader 16 or as a separate layer of layer 26. In some embodiments such catalysts include metals such as nickel, iron and cobalt which are selected to improve the efficiency of the deposition process.

After the prepared thermal interface material 24 has been formed on either the heat spreader 16 or, alternatively on layer 26 which was previously applied to the heat spreader substrate, the structure 24 is then thermally coupled to the backside surface of the die 14. The thermal coupling is improved by orienting the free ends of the nanotubes to engage the backside of silicon die 18. In some embodiments the coupling is directly to the backside of die 14 and in other embodiments the coupling is to a layer 30 on die 14.

In some embodiments, spacers 28 are inserted between die 14 and heat spreader 16 to define a minimum gap width. On such spacer is shown in the detail view of FIG. 2. In some embodiment multiple spacers 28 may be distributed about the perimeter of thermal interface material 24.

If the height h of the spacers 28 is less than the thickness of thermal interface material 24 by a predetermined amount when the die and the heat spreader are forced together during assembly until they both contact spacers 28, a controlled bias force is applied between the free ends of some carbon nanotubes of the array of carbon nanotubes 25 and the backside surface of die 14 to provide a good thermal contact.

In some embodiments, a surface of the heat spreader is formed from a material having a hardness substantially less than that of the nanotubes and free ends 27 of at least some of the carbon nanotubes 26 project from the array of carbon nanotubes 24 to embed them in the surface 26 of the heat spreader 16 as shown in the detail 2B which is not to scale. In some embodiments the surface is a coating 26.

By increasing the difference between the thickness of the thermal interface material 24 and the height of the gap defined by spacer 28, the bias force for the junction between thermal intermediate 24 and die 14 can be controllably increased when a sufficient loading force is applied to the heat spreader 16 to have the spacer 28 engage both the surface of both heat spreader 16 and die 14. By controlling the loading force and limiting it to a predetermined maximum force, the array of nanotubes 25 of the thermal interface material 24 will be deformed elastically by the bias force so that the highly conductive longitudinally oriented carbon nanotubes remain intact while they establish a highly conductive path between the die and heat spreader.

In some embodiments. the free ends of some of the individual nanotubes of the array of carbon nanotubes in the array of nanotubes 25 in thermal interface material 24 make generally perpendicular contact with the entire surface of die substrate 18. This also allows the thermal interface material 24 to efficiently engage the entire surface of die 14 even if it is not perfectly smooth.

Substantial alignment of the longitudinal axes of many nanotubes of the of the array of carbon nanotubes 25 so that they are substantially perpendicular to the surface of die 14 provides a thermal path with direct, low thermal resistance between the surface of die 14 and heat spreader 16.

In some embodiments, free ends of the carbon nanotubes of the carbon nanotube array of the thermal interface material may contact a layer 30. In some embodiments, layer 30 is a metal film of gold or silver or other suitable metal or alloy having high thermal conductivity and which may be readily deposited on the surface of die substrate 18. Layer 30 provides a reduced thermal resistance thermal coupling between the surface of die 14 and the carbon nanotubes of thermal interface material 24.

In some embodiments, at least some of the carbon nanotubes of the thermal interface material 24 are coated or partially coated with gold, silver, platinum or other suitable metals or alloys by physical deposition or sputtering methods which are known. Such metal coated nanotubes may further reduce the contact thermal resistance between nanotubes of the thermal interface material 24 and either the surface of die 14 or the buffer 30 on the surface of die 14.

Some embodiments include a number of methods. For example, FIG. 3 is a flow chart illustrating several methods according to various embodiments. Thus, a method 311 may (optionally) begin at block 321 with coupling a heat source to a first surface of an array of substantially aligned carbon nanotubes and interposing a layer between at least one of either a heat source or a heat sink and at least one of either the first or a second surface of the array of carbon nanotubes in a block 325. The method may include bonding another surface of the heat source to a substrate in block 327.

In some embodiments block 321 of method 311 may also include forming a layer on the heat source and growing the array of substantially aligned carbon nanotubes on the layer.

In some embodiments block 325 of method 311 may also include applying an adhesion promoting layer between the heat sink and the array of carbon nanotubes.

Figure 4:
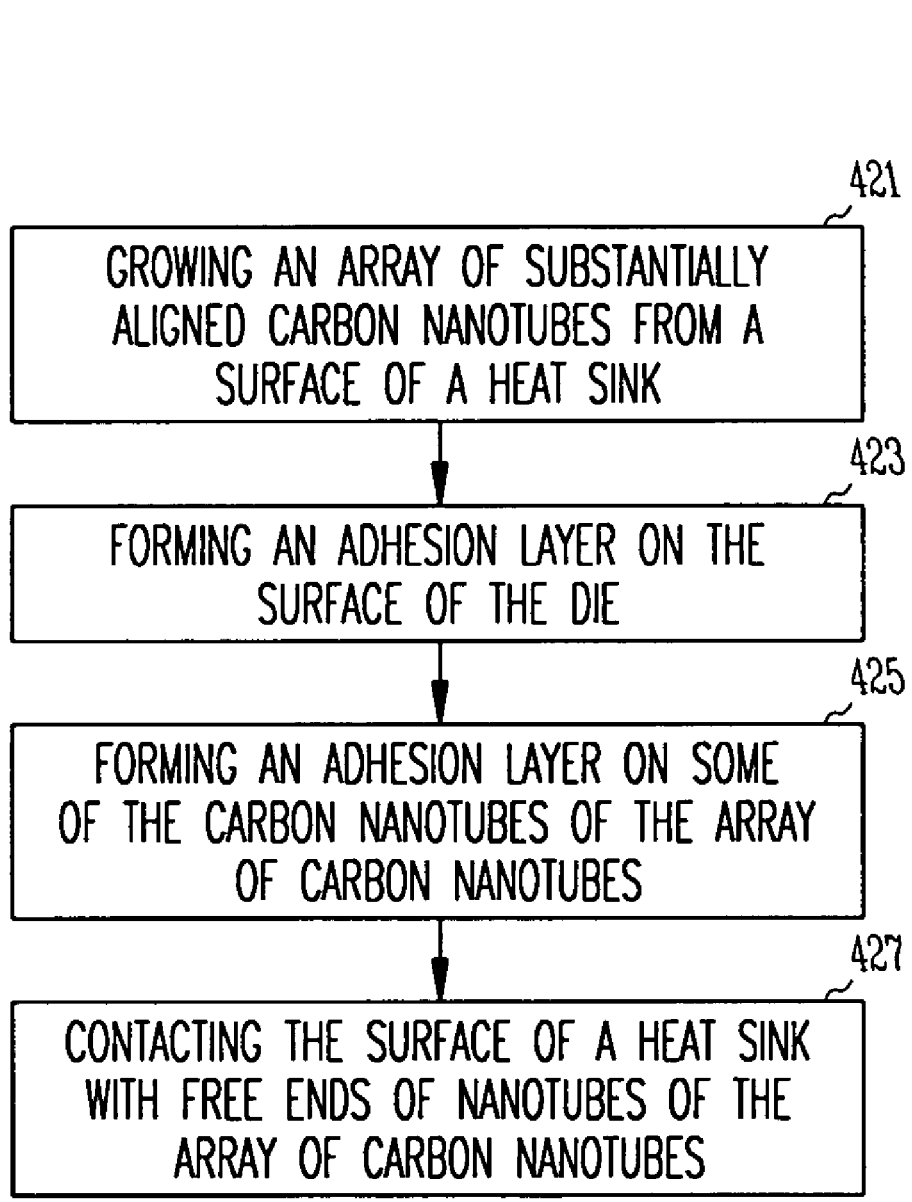

FIG. 4 is a flow chart of a method 411 illustrating several methods according to various embodiments. Thus, a method 411 may (optionally) begin at block 421 with growing an array of substantially aligned carbon nanotubes from a surface of a die and contacting the surface of a heat sink with free ends of some of the carbon nanotubes of the array of carbon nanotubes in block 423.

In some embodiments method 411 also comprises forming an adhesion layer on the surface of the die according to block 423.

In some embodiments method 411 also comprises forming an adhesion layer on some of the carbon nanotubes of the array of carbon nanotubes according to block 425.

Figure 5:
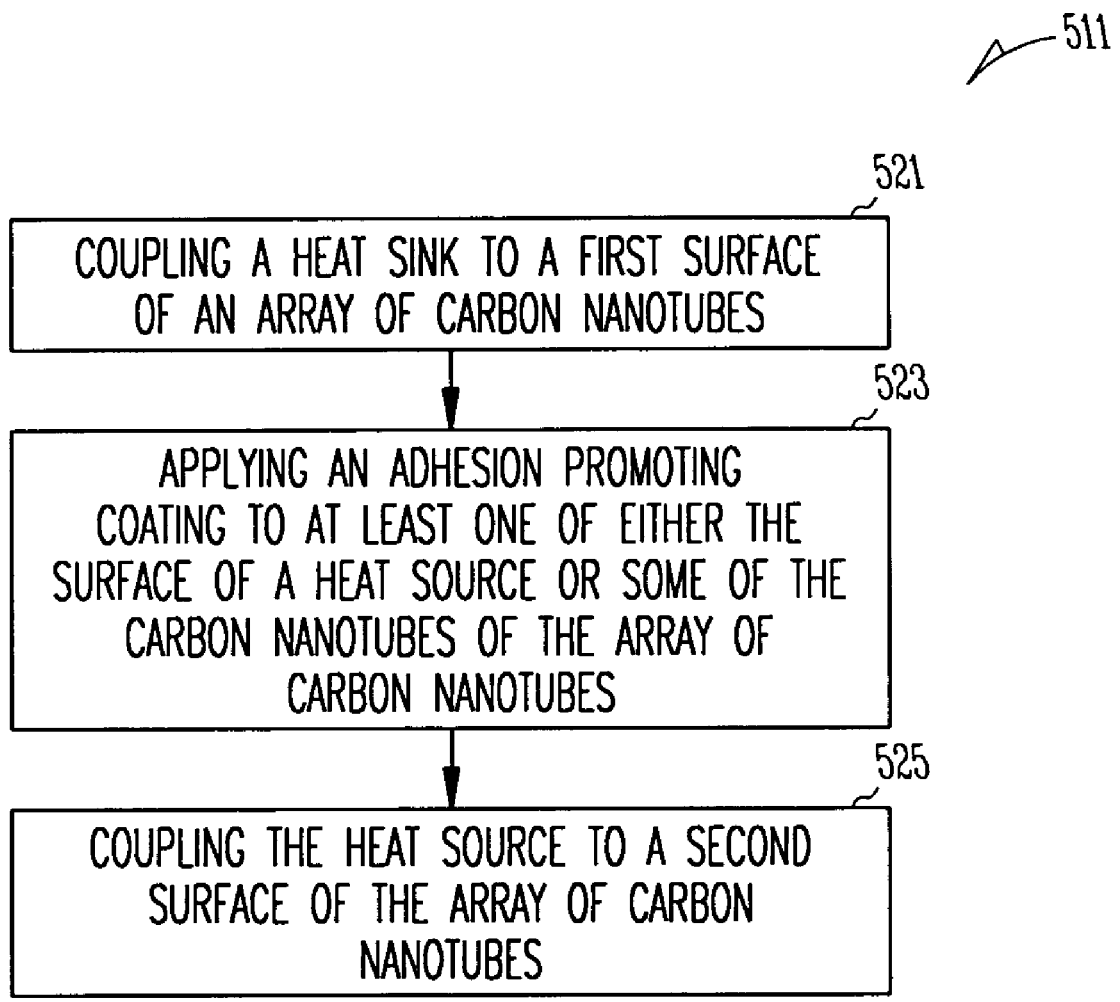

FIG. 5 is a flow chart of a method 511 illustrating several methods according to various embodiments. Thus, a method 511 may (optionally) begin at block 521 with coupling a heat sink to a first surface of an array of carbon nanotubes and, in block 523, applying an adhesion promoting coating to at least one of either the surface of a heat source or some of the carbon nanotubes of the array of carbon nanotubes. In some embodiments method 511 also comprises coupling the heat source to a second surface of the array of carbon nanotubes in block 525, In some embodiments applying an adhesion promoting coating to the surface of the heat source of block 523 comprises applying a metal.

In some embodiments applying an adhesion promoting coating to some of the carbon nanotubes of block 523 comprises sputtering a metal coating on the carbon nanotubes.

In some embodiments applying an adhesion layer to the heat sink of block 523 comprises applying a chemical adhesion promoting layer.

Figure 6:
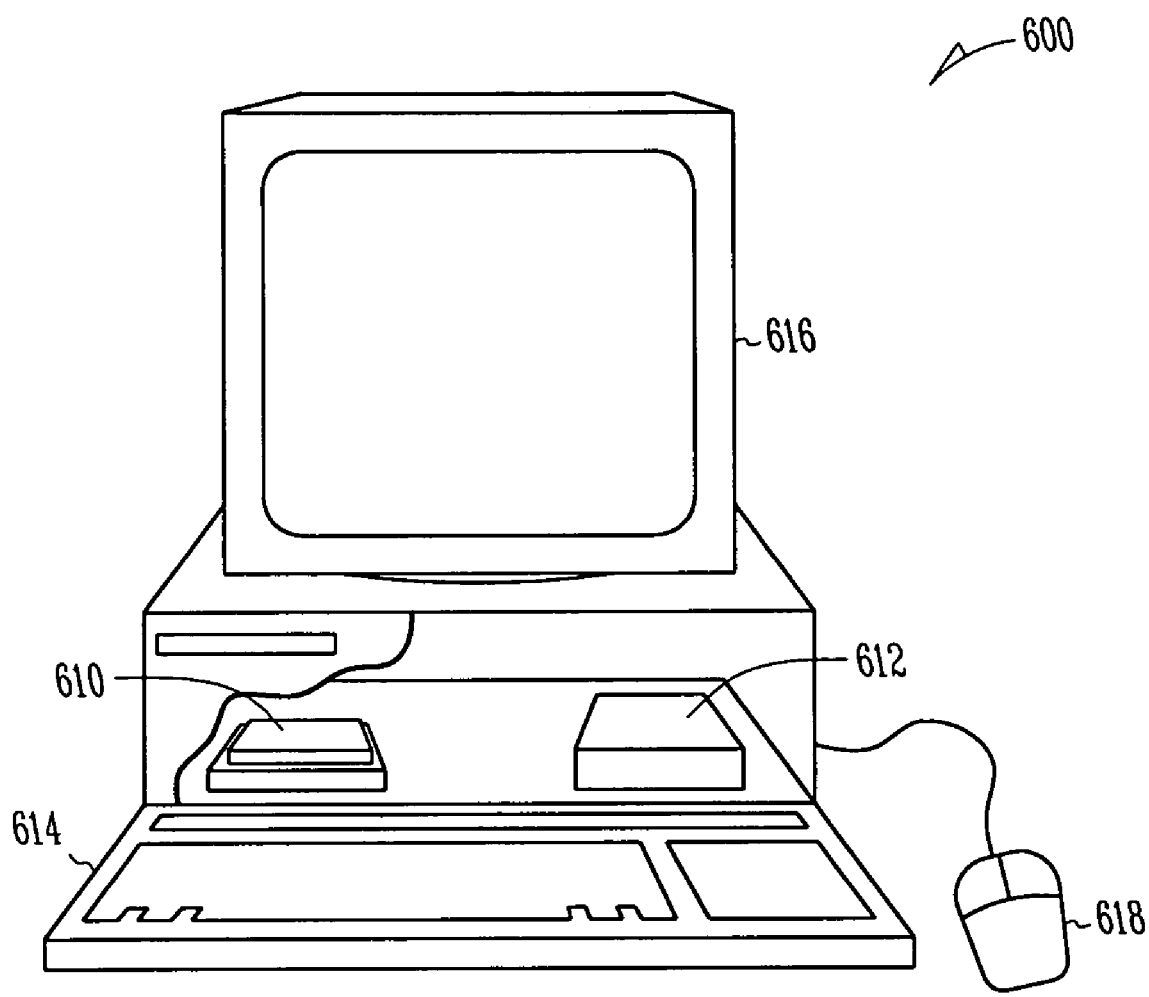
FIG. 6 is a depiction of a computing system according to an embodiment.

FIG. 6 is a depiction of a computing system according to an embodiment. One or more of the embodiments of apparatus with one or more dies having a thermal intermediate with a thermal interface layer and a buffer layer interposed between the die and a heat spreader may be used in a computing system such as a computing system 600 of FIG. 6. The computing system 600 includes at least one processor (not pictured), which is enclosed in a microelectronic device package 610, a data storage system 612, at least one input device such as a keyboard 614, and at least one output device such as a monitor 616, for example. In some embodiments' the data storage system 612 is a memory device such as a dynamic random access device. The computing system 600 includes a processor that processes data signals, and may include, for example, a microprocessor available from Intel Corporation. In addition to the keyboard 614, an embodiment of the computing system includes a further user input device such as a mouse 618, for example.

For the purposes of this disclosure, a computing system 600 embodying components in accordance with the claimed subject matter may include any system that utilizes a microelectronic device package, which may include, for example, a data storage device such as dynamic random access memory, polymer memory, flash memory and phase change memory. The microelectronic device package can also include a die that contains a digital signal processor (DSP), a micro-controller, an application specific integrated circuit (ASIC), or a microprocessor.

Embodiments set forth in this disclosure can be applied to devices and apparatus other than a traditional computer. For example, a die can be packaged with an embodiment of the thermal interface material and buffer layer, and placed in a portable device such as a wireless communicator or a hand held device such as a personal data assistant or the like.

Another example is a die that can be coupled to a heat sink with an embodiment of the thermal interface material and buffer layer and placed in a dirigible craft such as an automobile, a watercraft, an aircraft or a spacecraft.

The apparatus 10, substrate 12, die 14, heat spreader 16, integrated circuit 20, solder bumps 22 thermal interface material 24 and layers 26 and 30, spacer 28 and aligned nanotube array 24 may all be characterized as "modules" herein. Such modules may include hardware circuitry, and/or a processor and/or memory circuits, software program modules and objects, and/or firmware, and combinations thereof, as desired by the architect of the apparatus 10 and system 600, and as appropriate for particular implementations of various embodiments. For example, such modules may be included in a system operations simulation package, such as a software electrical signal simulation package, a power usage and distribution simulation package, a thermo-mechanical stress simulation package, a power/heat dissipation simulation package, and/or a combination of software and hardware used to simulate the operation of various potential embodiments.

It should also be understood that the apparatus and systems of various embodiments can be used in applications other than for coupling and heat transfer between dice and heat sinks, and thus, these embodiments are not to be so limited. The illustrations of apparatus 10 and system 600 are intended to provide a general understanding of the elements and structure of various embodiments, and they are not intended to serve as a complete description of all the features of compositions, apparatus, and systems that might make use of the elements and structures described herein.

Applications that may include the novel apparatus and systems of various embodiments include electronic circuitry used in high-speed computers, communication and signal processing circuitry, data transceivers, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

What is claimed is:

1. An apparatus, comprising:
   a die;
   a heat spreader mounted adjacent the die;
   a buffer layer comprising a film selected from the group consisting of Cr, Mo, Ti, SiC and TiC and wherein the buffer layer also comprises a catalyst for carbon nanotube growth selected from the group consisting of at least one of Co, Fe and Ni formed above a surface of the heat spreader; and
   a thermal interface material interposed in a gap between the die and the heat spreader; the thermal interface material comprising an array of carbon nanotubes formed above the buffer layer; and
   a further buffer layer of at least one material selected from the group comprising Au and Ag, interposed between the interface material and the die.

2. The apparatus of claim 1, wherein selected carbon nanotubes of the array of carbon nanotubes are bonded to adjacent carbon nanotubes of the array of carbon nanotubes.

3. The apparatus of claim 1, wherein a portion of at least some carbon nanotubes of the array of carbon nanotubes are coated with metal.

4. The apparatus of claim 1, wherein the length of at least some of the carbon nanotubes are under compression.

5. The apparatus of claim 1, wherein free ends of at least some of the carbon nanotubes project from the thermal intermediate material to embed them in the surface of the heat spreader.

6. The apparatus of claim 1 wherein the gap between the die and the heat spreader is established by the height of a spacer inserted in the gap.

7. A computing system, comprising:
   a die including a die surface and a circuit;
   a heat sink;
   at least one dynamic random access memory device; and
   a buffer layer comprising a film selected from the group consisting of Cr, Mo, Ti, SiC and TiC, wherein the buffer layer also comprises a catalyst for carbon nanotube growth selected from the group consisting of at least one of Co, Fe and Ni formed above a surface of the heat sink;
   a thermal interface material interposed in a gap between the die and the heat sink; the thermal interface material comprising an array of carbon nanotubes formed above the buffer layer; and
   a further buffer layer of at least one material selected from the group comprising Au and Ag, interposed between the interface material and the die.

8. The system of claim 7, wherein the circuit comprises a processor that acts upon data signals.

9. The system of claim 8, wherein the processor includes a microprocessor.

10. An apparatus, comprising:
a die;
a heat spreader mounted adjacent the die;
a buffer layer comprising a film selected from the group consisting of Cr, Mo, Ti, SiC and TiC and wherein the buffer layer also comprises a catalyst for carbon nanotube growth selected from the group consisting of at least one of Co, Fe and Ni formed on a surface of the heat spreader;
a thermal interface material interposed in a gap between the die and the heat spreader; the thermal interface material comprising an array of carbon nanotubes formed in contact with the buffer layer; and
a further buffer layer of at least one material selected from the group comprising Au and Ag, interposed between the interface material and the die.

11. The apparatus of claim 10, wherein selected carbon nanotubes of the array of carbon nanotubes are bonded to adjacent carbon nanotubes of the array of carbon nanotubes.

12. The apparatus of claim 10, wherein a portion of at least some carbon nanotubes of the array of carbon nanotubes are coated with metal.

13. The apparatus of claim 10, wherein the length of at least some of the carbon nanotubes are under compression.

14. The apparatus of claim 10, wherein free ends of at least some of the carbon nanotubes project from the array of carbon nanotubes to embed them in the surface of the heat spreader.

15. The apparatus of claim 10 wherein the gap between the die and the heat spreader is established by the height of a spacer inserted in the gap.

* * * * *